(12) United States Patent
Kim et al.

(10) Patent No.: US 7,871,887 B2
(45) Date of Patent: Jan. 18, 2011

(54) SEMICONDUCTOR DEVICE WITH REDUCED RESISTANCE OF BIT LINES AND METHOD FOR MANUFACTURING THE SAME

(75) Inventors: Kyung Do Kim, Seoul (KR); Seung Joo Baek, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 273 days.

(21) Appl. No.: 12/137,865

(22) Filed: Jun. 12, 2008

(65) Prior Publication Data

US 2009/0256194 A1    Oct. 15, 2009

(30) Foreign Application Priority Data

Apr. 10, 2008    (KR) .............. 10-2008-0033300

(51) Int. Cl.
  *H01L 21/336* (2006.01)
  *H01L 29/76* (2006.01)
(52) U.S. Cl. .................... 438/270; 257/329
(58) Field of Classification Search .............. None
  See application file for complete search history.

(56) References Cited

U.S. PATENT DOCUMENTS

| 5,376,575 | A  | * | 12/1994 | Kim et al. ............ 438/239 |
| 5,504,357 | A  | * | 4/1996  | Kim et al. ............ 257/306 |
| 6,504,200 | B2 | * | 1/2003  | Schlosser et al. .......... 257/301 |
| 7,692,231 | B2 | * | 4/2010  | Suh ................ 257/296 |
| 2002/0079527 | A1 | * | 6/2002 | Schlosser et al. ......... 257/301 |
| 2004/0191984 | A1 | * | 9/2004 | Piazza et al. .......... 438/243 |
| 2005/0054158 | A1 | * | 3/2005 | Divakaruni et al. ......... 438/246 |
| 2006/0258084 | A1 | * | 11/2006 | Tang et al. ........... 438/239 |
| 2008/0296671 | A1 | * | 12/2008 | Takaishi ............ 257/330 |
| 2009/0230466 | A1 | * | 9/2009 | Kim .................. 257/331 |
| 2009/0302380 | A1 | * | 12/2009 | Graf et al. ............ 257/330 |

FOREIGN PATENT DOCUMENTS

KR    1995-0028065 B1    10/1995

* cited by examiner

*Primary Examiner*—Scott B Geyer
(74) *Attorney, Agent, or Firm*—Ladas & Parry LLP

(57) ABSTRACT

A semiconductor device comprises buried bit lines which are formed to be brought into contact with drain areas of vertical pillar transistors. The buried bit lines are arranged along a first direction in a silicon substrate. The buried bit lines are formed of epi-silicon to reduce the resistance of the buried bit lines.

23 Claims, 7 Drawing Sheets

SEMICONDUCTOR DEVICE WITH REDUCED RESISTANCE OF BIT LINES AND METHOD FOR MANUFACTURING THE SAME

CROSS-REFERENCE TO RELATED APPLICATIONS

The present application claims priority to Korean patent application number 10-2008-0033300 filed on Apr. 10, 2008, which is incorporated herein by reference in its entirety.

BACKGROUND OF THE INVENTION

The present invention relates to a semiconductor device and a method for manufacturing the same, and more particularly, to a semiconductor device which has vertical pillar transistors and can reduce the resistance of buried bit lines and a method for manufacturing the same.

As the integration level of semiconductor devices increases, the area that is occupied by each unit cell when viewed from the top has decreased. In order to accommodate the reduction in the unit cell area, various methods for forming transistors, bit lines, word lines, and capacitors in a limited area have been researched.

In one method, a semiconductor device having vertical pillar transistors, in which source areas and drain areas are located up and down in an active region to form vertical channels, has been proposed.

The vertical pillar transistor is formed in a manner such that a gate is formed in the sidewall of a silicon pillar constituting an active region, a source area is formed in the upper portion of the silicon pillar over the gate, and a drain area is formed in a silicon substrate under the silicon pillar.

In the semiconductor device having vertical pillar transistors, a cell scheme is decreased from 8F2 to 4F2; and thus the net die can be remarkably increased, and gate driving force can be increased due to the formation of a surrounding gate. In particular, in the semiconductor device having vertical pillar transistors, the channel length does not decrease even though the area of the transistor is decreased, and therefore the characteristics and the reliability of the semiconductor device can be elevated.

Meanwhile, while not concretely shown in a drawing, in the conventional semiconductor device having vertical pillar transistors, the bit lines are formed in a buried style by ion-implanting N-type impurities in the silicon substrate. Because of this fact, the resistance of the buried bit lines increases several thousand times when compared to the resistance of bit lines in the semiconductor device having planar channel transistors. Due to this fact, the semiconductor device having vertical pillar transistors suffers from defects in that current decreases, RC delay increases, and current driving capability is deteriorated.

Therefore, in the semiconductor device having vertical pillar transistors, the resistance of the bit lines must be necessarily reduced.

SUMMARY OF THE INVENTION

Embodiments of the present invention includes a method for manufacturing a semiconductor device which can reduce the resistance of bit lines.

Also, embodiments of the present invention include a method for manufacturing a semiconductor device which can reduce the resistance of bit lines, thereby improving the characteristics and the reliability of the semiconductor device.

In one aspect, a semiconductor device comprises buried bit lines which are formed to be brought into contact with drain areas of vertical pillar transistors. The buried bit lines are arranged along a first direction in a silicon substrate, and the buried bit lines are formed of epi-silicon.

The buried bit lines formed of the epi-silicon have a thickness in the range of 100~3,000 Å.

The semiconductor device further comprises a conductive pattern formed on portions of the buried bit lines between the vertical pillar transistors.

The conductive pattern is formed of epi-silicon.

The conductive pattern formed of the epi-silicon has a height in the range of 100~2,000 Å and a width in the range of 100~2,000 Å.

The conductive pattern formed of the epi-silicon is doped with impurities.

In another aspect, a semiconductor device comprises a silicon substrate having a plurality of silicon pillars; gates formed to be buried in surfaces of lower portions of the silicon pillars; source areas formed in portions of the silicon pillars over the gates; drain areas formed in portions of the silicon substrate under the gates; buried bit lines formed of epi-silicon in the silicon substrate such that they are brought into contact with the drain areas of those vertical pillar transistors, and the buried bit lines are arranged along a first direction among vertical pillar transistors including the gates, the source areas, and the drain areas; a first insulation layer filled between the buried bit lines; word lines formed on the first insulation layer to connect the gates of the vertical pillar transistors which are arranged along a second direction perpendicular to the first direction; and a second insulation layer filled between the vertical pillar transistors including the word lines.

The buried bit lines formed of the epi-silicon have a thickness in the range of 100~3,000 Å.

The semiconductor device further comprises a conductive pattern formed on portions of the buried bit lines between the vertical pillar transistors.

The conductive pattern is formed of epi-silicon.

The conductive pattern formed of the epi-silicon has a height in the range of 100~2,000 Å and a width in the range of 100~2,000 Å.

The conductive pattern formed of the epi-silicon is doped with impurities.

In still another aspect, a method for manufacturing a semiconductor device comprises the step of forming buried bit lines by growing epi-silicon in a silicon substrate to be brought into contact with drain areas of vertical pillar transistors. The buried bit lines are arranged along a first direction.

The buried bit lines formed of the epi-silicon have a thickness in the range of 100~3,000 Å.

The method further comprises the step of forming a conductive pattern on portions of the buried bit lines between the vertical pillar transistors.

The conductive pattern is formed of epi-silicon.

The conductive pattern formed of the epi-silicon has a height in the range of 100~2,000 Å and a width in the range of 100~2,000 Å.

The conductive pattern formed of the epi-silicon is doped with impurities.

In a still further aspect, a method for manufacturing a semiconductor device comprises the steps of etching a silicon substrate and thereby forming a plurality of silicon pillars; etching portions of the silicon substrate between the silicon pillars and thereby defining trenches extending along a first direction; growing epi-silicon in the trenches and thereby forming buried bit lines; isotropically etching surfaces of lower portions of the silicon pillars; forming gates to be buried in the lower portions of the silicon pillars which are isotropically etched; defining drain areas in portions of the silicon substrate under the gates; etching the buried bit lines such that the buried bit lines, which adjoin each other along a second direction perpendicular to the first direction, are separated from each other; filling a first insulation layer between and on the separated buried bit lines; forming word lines on the first insulation layer to connect the gates which are arranged along the second direction; filling a second insulation layer between the silicon pillars including the word lines; and defining source areas in portions of the silicon pillars over the gates such that vertical pillar transistors are constructed.

The step of forming the silicon pillars comprises the steps of forming a hard mask on the silicon substrate to cover silicon pillar forming areas; etching the silicon substrate and thereby defining first grooves; forming spacers on sidewalls of the first grooves and the hard mask; and etching portions of the silicon substrate on bottoms of the first grooves using the hard mask and the spacers as an etch mask and thereby defining second grooves.

The buried bit lines formed of the epi-silicon have a thickness in the range of 100~3,000 Å.

The method further comprises the step of forming a conductive pattern on portions of the buried bit lines between the vertical pillar transistors.

The conductive pattern is formed of epi-silicon.

The conductive pattern formed of the epi-silicon has a height in the range of 100~2,000 Å and a width of 100~2,000 Å.

The conductive pattern formed of the epi-silicon is doped with impurities.

DESCRIPTION OF SPECIFIC EMBODIMENTS

In the present invention, buried bit lines are formed of epi-silicon, and a conductive pattern made of epi-silicon is additionally formed on portions of the buried bit lines between vertical pillar transistors. As such, in the present invention, the resistance of the buried bit lines is reduced; and therefore, the characteristics and the reliability of a semiconductor device are improved.

Hereafter, specific embodiments of the present invention will be described in detail with reference to the attached drawings.

Figure 1:
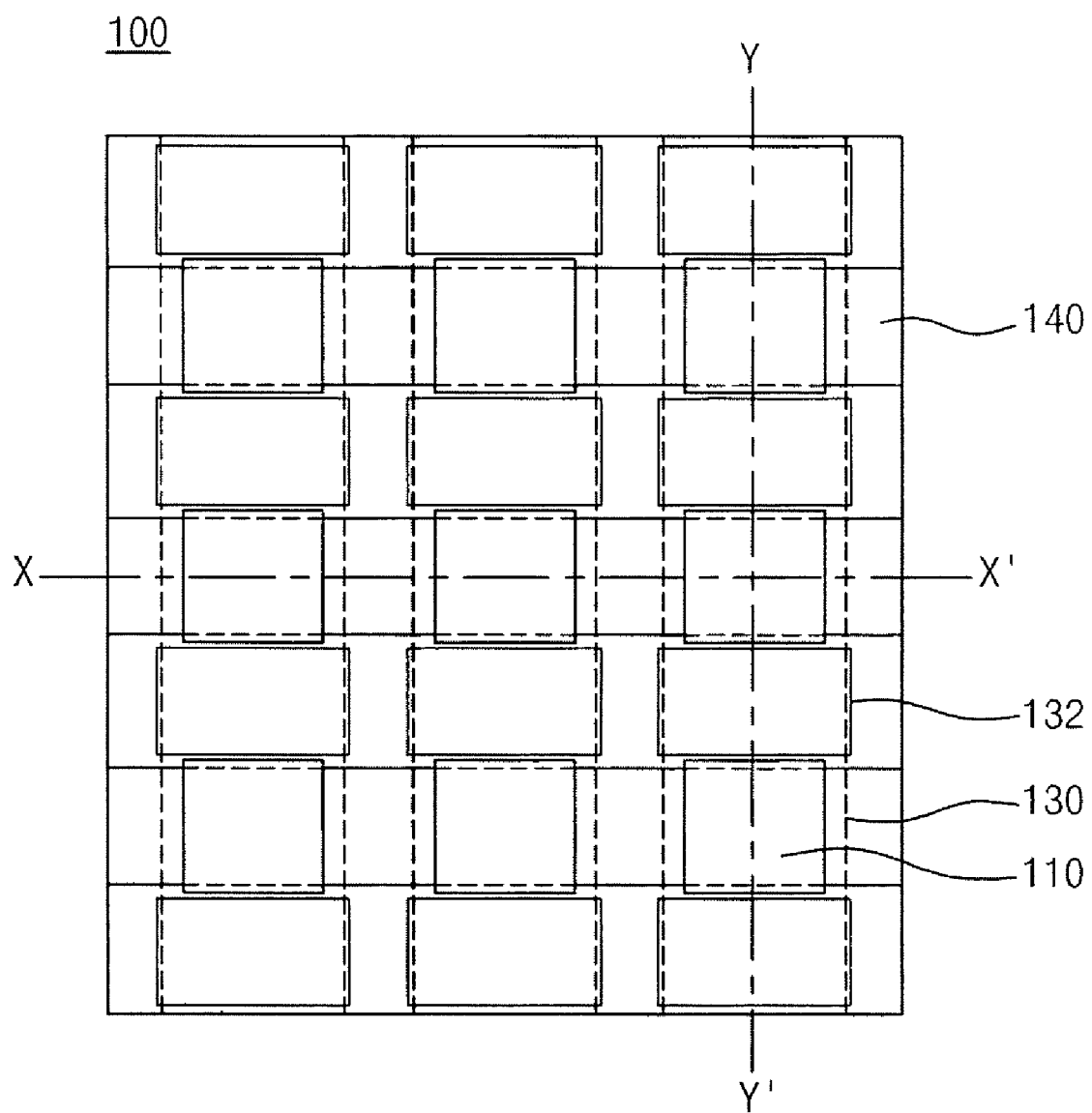
FIG. 1 is a plan view showing a semiconductor device having vertical pillar transistors in accordance with an embodiment of the present invention.
Figure 2A:
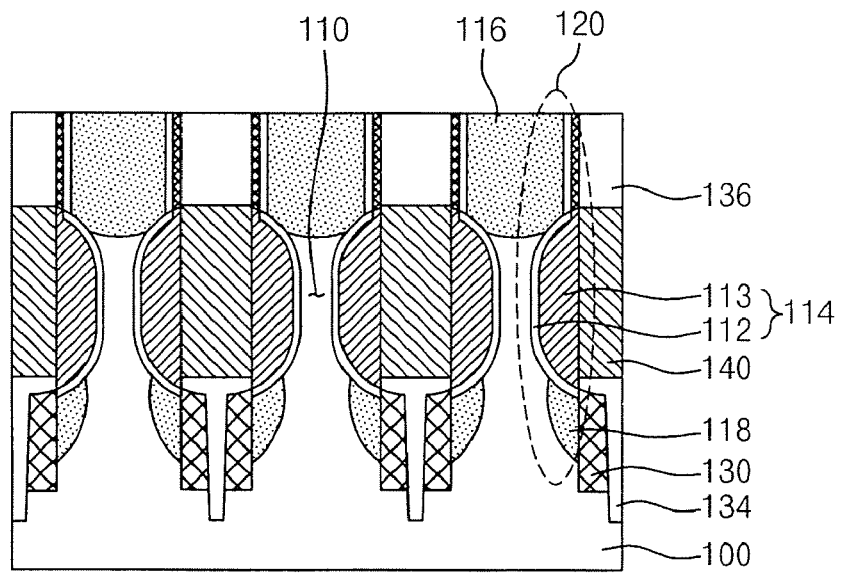
FIG. 2A is a cross-sectional view taken along line X-X' of FIG. 1.
Figure 2B:
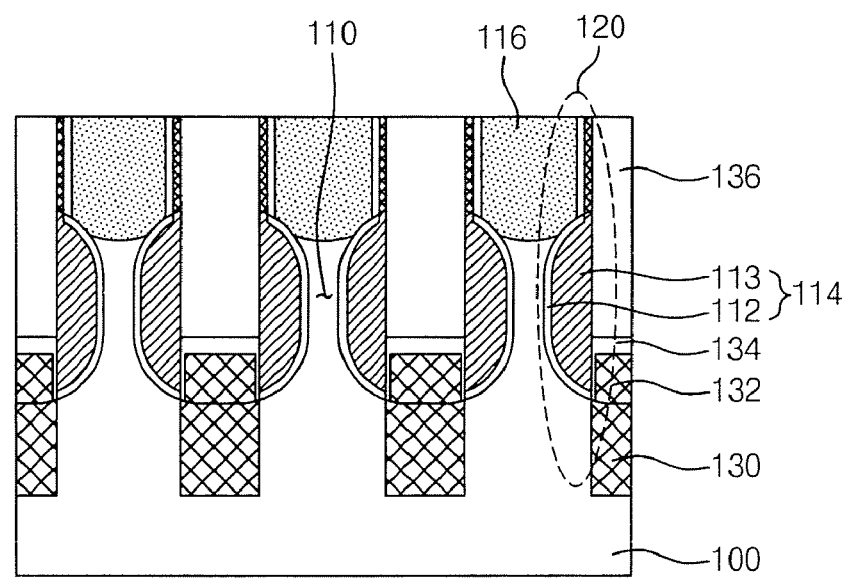
FIG. 2B is a cross-sectional view taken along line Y-Y' of FIG. 1.

FIG. 1 is a plan view showing a semiconductor device having vertical pillar transistors in accordance with an embodiment of the present invention, FIG. 2A is a cross-sectional view taken along line X-X' of FIG. 1, and FIG. 2B is a cross-sectional view taken along line Y-Y' of FIG. 1.

Referring to FIGS. 1, 2A, and 2B, a plurality of silicon pillars 110 are formed on a silicon substrate 100 in the form of a matrix, and vertical pillar transistors 120 including gates 114, source areas 116, and drain areas 118 are formed in the respective silicon pillars 110. Buried bit lines 130 are formed to be brought into contact with the drain areas 118 of the vertical pillar transistors 120, and the buried bit lines 130 are arranged in a first direction. Word lines 140 are formed to connect the gates 114 of the vertical pillar transistors 120, and the word lines 140 are arranged in a second direction perpendicular to the first direction.

Each vertical pillar transistor 120 includes the gate 114 which is formed to be buried in the surface of the lower portion of each silicon pillar 110, the source area 116 which is formed in the silicon pillar 110 over the gate 114, and the drain area 118 which is formed in the silicon substrate 100 under the gate 114. The gate 114 includes a gate insulation layer 112 comprising at least one of an oxide layer and the like, and a gate conductive layer 113 comprising at least one of a polysilicon layer and the like.

The buried bit lines 130 are formed of epi-silicon that is grown using a selective epitaxial growth process. The buried bit lines 130 formed of epi-silicon have a thickness in the range of 100~3,000 Å. Further, the buried bit lines 130 arranged in the second direction are insulated and separated from one another by a first insulation layer 134.

In succession, a conductive pattern 132 is additionally formed on portions of the buried bit lines 130 between the vertical pillar transistors 120. The conductive pattern 132 is formed to further reduce the resistance of the buried bit lines 130. Preferably, the conductive pattern 132 is formed of epi-silicon doped with predetermined conductivity type impurities (for example, N-type impurities) using a selective epitaxial growth process. The conductive pattern 132 formed of epi-silicon has a height in the range of 100~2,000 Å and a width in the range of 100~2,000 Å. The N-type impurities may be doped in situ when growing epi-silicon or after growing epi-silicon.

A second insulation layer 136 is filled between the vertical pillar transistors 120 including the word lines 140 to separate and insulate the vertical pillar transistors 120 from one another.

Accordingly, in the semiconductor device having the vertical pillar transistors according to the present invention the buried bit lines are formed of epi-silicon. As a result, the resistance of the buried bit lines is significantly reduced when compared to the conventional art, in which buried bit lines are formed through ion implantation of N-type impurities. Moreover, in the semiconductor device having the vertical pillar transistors according to the present invention, due to the fact that the conductive pattern formed of doped epi-silicon is additionally formed on the portions of the buried bit lines which are located between the vertical pillar transistors, the resistance of the buried bit lines is further reduced.

Therefore, in the semiconductor device having the vertical pillar transistors according to the present invention, it is possible to form buried bit lines having significantly lower resistance than those of the conventional art; and therefore, the characteristics and the reliability of the semiconductor device can be improved.

FIGS. 3A through 3G are cross-sectional views taken along line X-X' in FIG. 1 shown for illustrating the processes of a method for manufacturing a semiconductor device in accordance with another embodiment of the present invention; FIG. 4A is a cross-sectional view taken along line Y-Y' in FIG. 1 and corresponds to FIG. 3C; and FIG. 4B is a cross-sectional view taken along the line Y-Y' of FIG. 1 and corresponds to FIG. 3G.

Figure 3A:
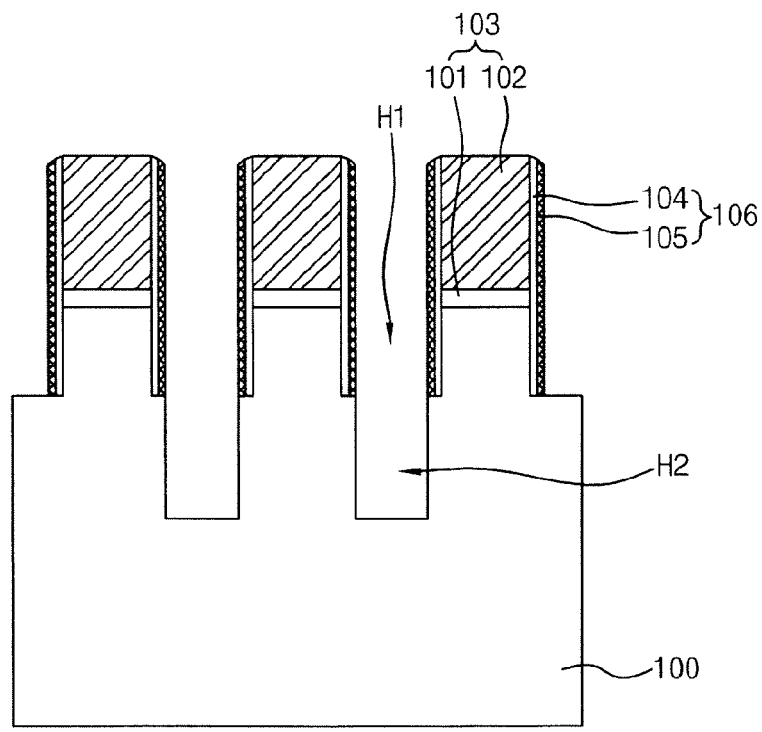
FIGS. 3A through 3G are cross-sectional views taken along the line X-X' of FIG. 1 shown for illustrating the processes of a method for manufacturing a semiconductor device in accordance with another embodiment of the present invention.
Figure 4A:
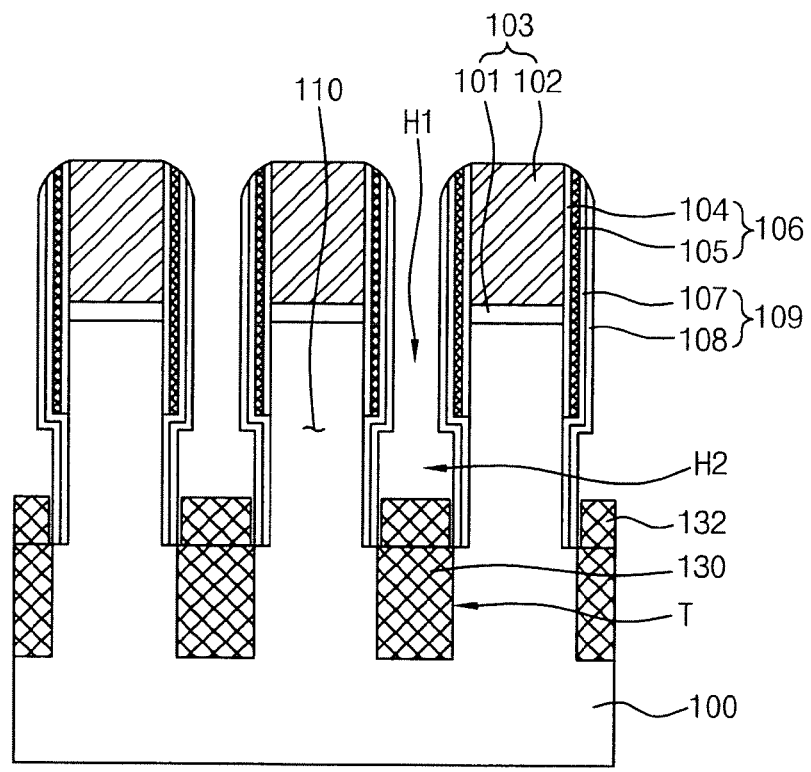
FIG. 4A is a cross-sectional view taken along the line Y-Y' of FIG. 1 and corresponding to FIG. 3C.
Figure 4B:
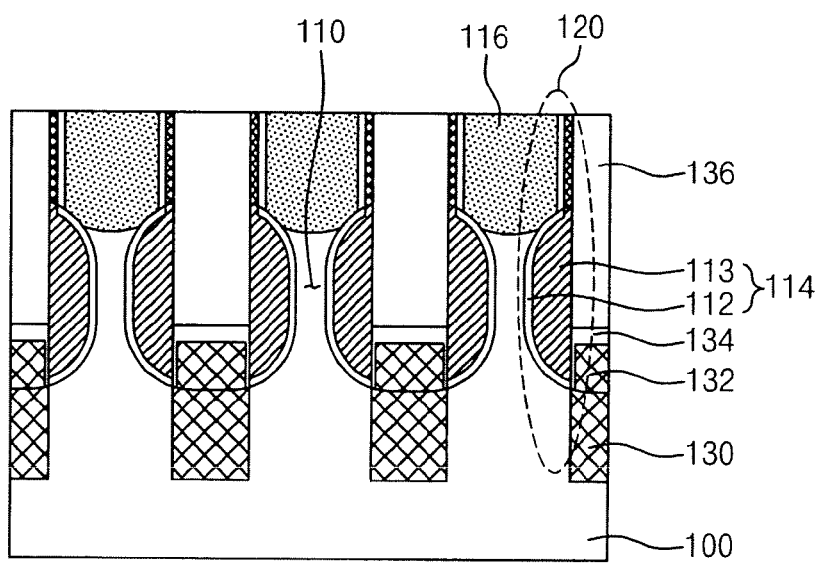
FIG. 4B is a cross-sectional view taken along the line Y-Y' of FIG. 1 and corresponding to FIG. 3G.

Referring to FIG. 3A, a pad oxide layer 101 and a pad nitride layer 102 are sequentially formed on a silicon substrate 100. Thereafter, by etching the pad nitride layer 102 and the pad oxide layer 101, a hard mask 103 is formed to cover the portions, that is, the silicon pillar forming regions, of the silicon substrate 100. The exposed portions of the silicon substrate 100, which are not covered by the hard mask 103, are etched using the hard mask 103 as an etch mask to define first grooves H1 having a predetermined depth.

A first oxide layer 104 and a first nitride layer 105 are sequentially formed on the hard mask 103 including the surfaces of the first grooves H1. Thereafter the first nitride layer 105 and the first oxide layer 104 are etched back to form first spacers 106 on the sidewalls of the first grooves H1 and the hard mask 103. Then, portions of the silicon substrate 100 on the bottoms of the first grooves H1 are etched using the hard mask 103 and the first spacers 106 as an etch mask to define second grooves H2. Through this, a plurality of silicon pillars 110 are defined by the first grooves H1 and the second grooves H2 and are arranged in the form of a matrix.

Figure 3B:
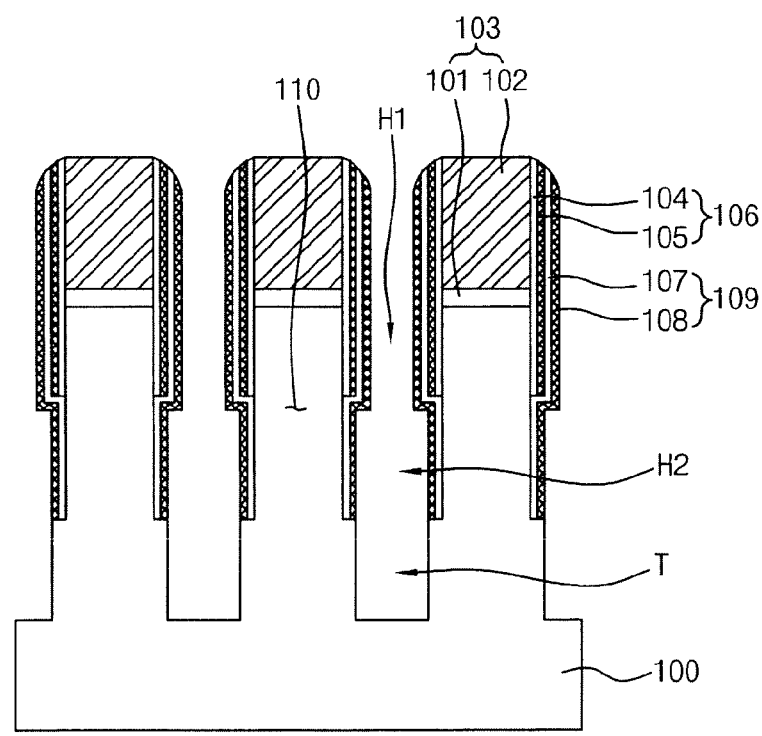

Referring to FIG. 3B, a second oxide layer 107 and a second nitride layer 108 are sequentially formed on the surfaces of the second grooves H2, the first spacers 106, and the hard mask 103. The second oxide layer 107 and the second nitride layer 108 are then etched back to form second spacers 109 on the sidewalls of the second grooves H2 and the first spacers 106. The portions of the silicon substrate 100 at the bottoms of the second grooves H2 are etched using the second spacers 109 and the hard mask 103 as an etch mask to define trenches T extending in the first direction. The trenches T define the areas in which buried bit lines are to be formed. The trenches T have a depth in the range of 100~3,000 Å.

Figure 3C:
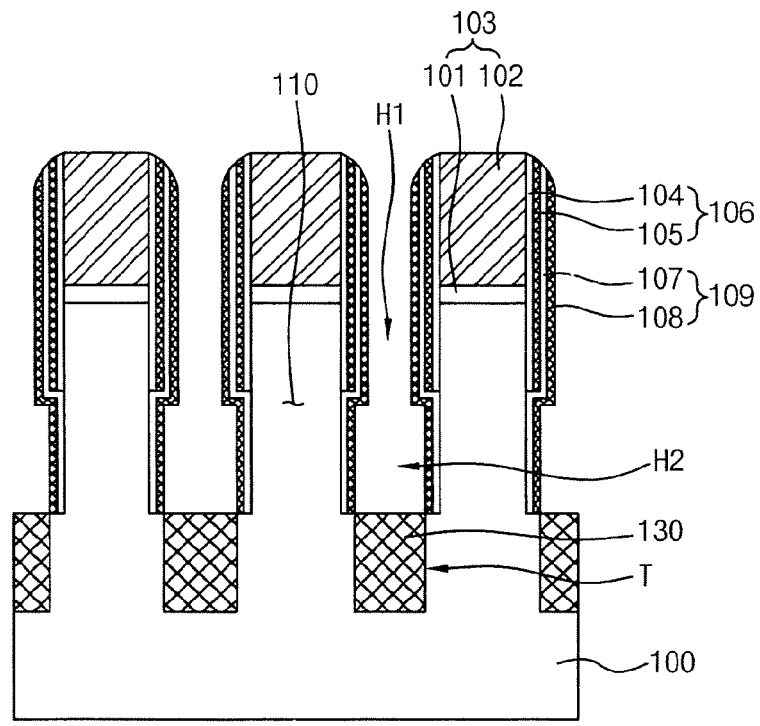

Referring to FIGS. 3C and 4A, epi-silicon is grown through a selective epitaxial growth process to fill the trenches T, and through this, buried bit lines 130 made of epi-silicon and extending in the first direction are formed in the trenches T. The epi-silicon is grown to a thickness capable of filling the trenches T, preferably, in the range of 100~3,000 Å. Accordingly, the buried bit lines 130 made of the epi-silicon are formed to have a thickness in the range of 100~3,000 Å.

A conductive pattern 132 made of epi-silicon is formed on the portions of the buried bit lines 130 between the silicon pillars 110. The epi-silicon as the material of the conductive pattern 132 is formed using a selective epitaxial growth process, preferably, by doping predetermined conductivity type impurities, i.e., N-type impurities. At this time, the doping of the N-type impurities is conducted in situ when growing the epi-silicon or after growing the epi-silicon. The conductive pattern 132 made of the epi-silicon is formed to reduce the resistance of the buried bit lines 130, and preferably, has a height in the range of 100~2,000 Å and a width in the range of 100~2,000 Å.

Here, in the present invention, since the buried bit lines 130 are formed of epi-silicon, they have a significantly lower resistance than the conventional buried bit lines which are formed through impurity ion implantation. Also, in the present invention, due to the fact that the conductive pattern 132 made of the epi-silicon is formed on the portions of the buried bit lines 130 between the silicon pillars 110, that is, between vertical pillar transistors, there is a further reduction of the resistance of the buried bit lines 130 when compared to the conventional buried bit lines.

Figure 3D:
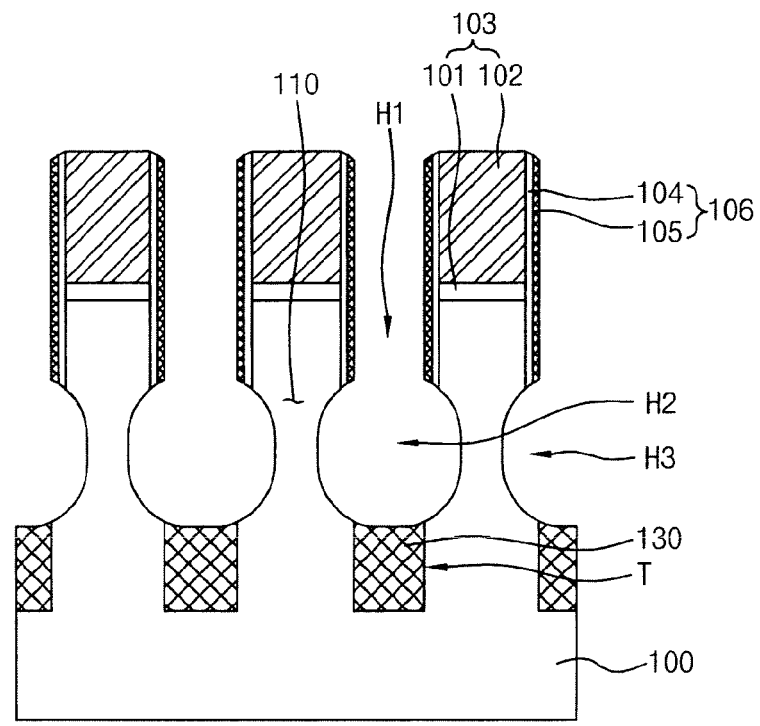

Referring to FIG. 3D, the second spacers 109 are removed using a well-known process. Then, the surfaces of the lower portions of the silicon pillars 110, which correspond to the sidewalls of the second grooves H2 and which are exposed due to the removal of the second spacers 109, are isotropically etched, and through this, third grooves H3 having a semicircular sectional shape are defined in the surfaces of the lower portions of the silicon pillars 110. The third grooves H3 having the semicircular sectional shape extend annularly.

Figure 3E:
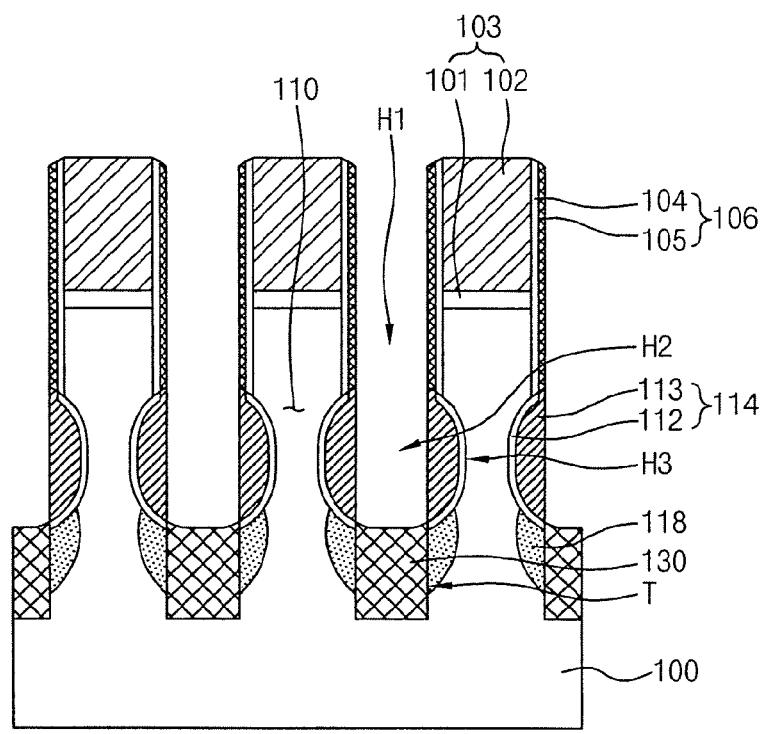

Referring to FIG. 3E, a gate insulation layer 112 comprising an oxide layer or the like and a gate conductive layer 113 comprising a polysilicon layer of the like are sequentially formed on the resultant portion of the silicon substrate 100 having the semicircular third grooves H3 defined therein. Thereafter, the gate conductive layer 113 and the gate insulation layer 112 are etched back to form gates 114 that are buried in the third grooves H3. Here, the gates 114 are formed such that they fill the third grooves H3 while extending annularly to surround the lower portions of the silicon pillars 110.

By conducting ion implantation of predetermined conductivity type impurities, for example, N-type impurities, for the resultant silicon substrate 100 formed with the gates 114, drain areas 118 are defined in the portions of the silicon substrate 100 under the gates 114. The drain areas 118 are defined such that they contact with the buried bit lines 130. At this time, the ion implantation of the N-type impurities for forming the drain areas 118 can be conducted in a sloped ion implantation style and concurrently in the buried bit lines 130.

Figure 3F:
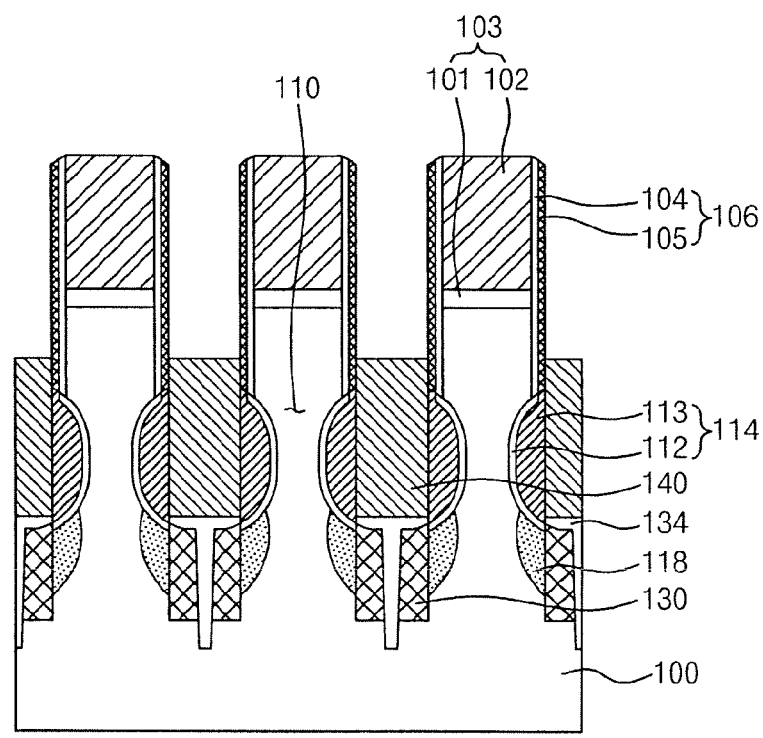

Referring to FIG. 3F, the buried bit lines 130 are etched such that the buried bit lines 130 adjoining each other are separated from each other in the second direction. Then, a first insulation layer 134 is formed in such a way as to fill the spaces between separated buried bit lines 130 and the second grooves H2. A conductive layer, for example, a polysilicon layer, is deposited on the first insulation layer 134, and the polysilicon layer is then etched to form word lines 140 connecting the annular gates 114 and arranged in the second direction perpendicular to the first direction.

Figure 3G:
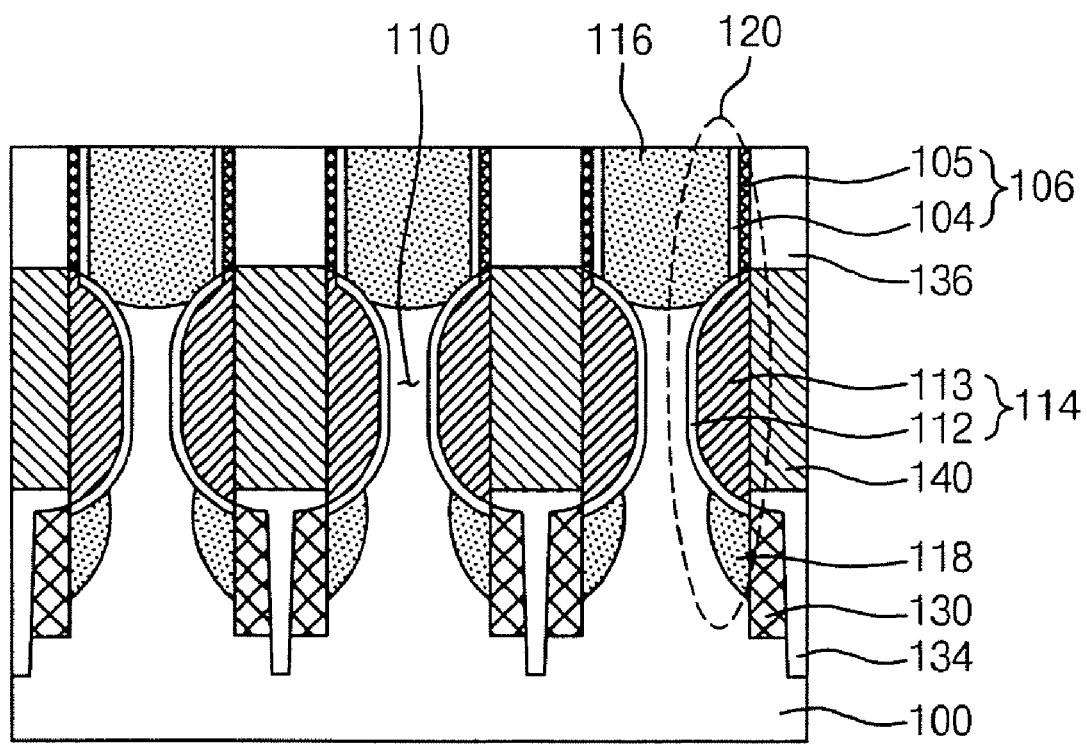

Referring to FIGS. 3G and 4B, a second insulation layer 136 is deposited on the resultant silicon substrate 100 formed with the word lines 140 to fill the spaces between the silicon pillars 110. The second insulation layer 136 is then removed until the hard mask 103 is exposed. The removal of the second insulation layer 136 is preferably conducted using a CMP (chemical mechanical polishing) process.

The hard mask 103 is removed such that the silicon pillars 110 are exposed. At this time, when viewed from a cross-section, the portions of the second insulation layer 136, which exist over the silicon pillars 110, are simultaneously removed. Next, through conducting ion implantation of predetermined conductivity type impurities, for example, N-type impurities, in the portions of the silicon pillars 110 exposed over the gates 114, source areas 116 are formed. Through this, vertical pillar transistors 120 including the gates 114, the source areas 116, and the drain areas 118 are formed.

Thereafter, while not shown in the drawings, by sequentially conducting a series of subsequent processes including processes for forming storage node contacts to be brought into contact with the source areas 116 of the vertical pillar transistors 120, the manufacture of the semiconductor device having vertical pillar transistors according to the present invention is completed.

As is apparent from the above description, in the present invention, buried bit lines are formed of epi-silicon; and also, a conductive pattern made of doped epi-silicon is additionally formed on portions of the buried bit lines located between vertical pillar transistors, whereby the resistance of the buried bit lines are significantly reduced when compared to the conventional art in which buried bit lines are formed through impurity ion implantation. Accordingly, in the present invention, it is possible to realize a semiconductor device having vertical pillar transistors which include the buried bit lines having a significantly low resistance, and thereby the characteristics and the reliability of the semiconductor device are improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
   buried bit lines formed to be brought into contact with drain areas of vertical pillar transistors, the buried bit lines being arranged along a first direction in a silicon substrate, wherein the buried bit lines are formed of epi-silicon;
   a conductive pattern formed on portions of the buried bit lines between the vertical pillar transistors.

2. The semiconductor device according to claim 1, wherein the buried bit lines formed of the epi-silicon have a thickness in the range of 100~3,000 Å.

3. The semiconductor device according to claim 1, wherein the conductive pattern is formed of epi-silicon.

4. The semiconductor device according to claim 3, wherein the conductive pattern formed of the epi-silicon has a height in the range of 100~2,000 Å and a width in the range of 100~2,000 Å.

5. The semiconductor device according to claim 3, wherein the conductive pattern formed of the epi-silicon is doped with impurities.

6. A semiconductor device comprising:
   a silicon substrate having a plurality of silicon pillars;
   gates formed to be buried in surfaces of lower portions of the silicon pillars;
   source areas formed in portions of the silicon pillars over the gates;
   drain areas formed in portions of the silicon substrate under the gates;
   buried bit lines formed of epi-silicon in the silicon substrate such that the buried bit lines are brought into contact with the drain areas of the vertical pillar transistors, the buried bit lines being arranged along a first direction among the vertical pillar transistors including the gates, the source areas, and the drain areas;
   a first insulation layer filled between the buried bit lines;
   word lines formed on the first insulation layer to connect the gates of the vertical pillar transistors, the word lines being arranged along a second direction perpendicular to the first direction; and
   a second insulation layer filled between the vertical pillar transistors including the word lines.

7. The semiconductor device according to claim 6, wherein the buried bit lines formed of the epi-silicon have a thickness in the range of 100~3,000 Å.

8. The semiconductor device according to claim 7, further comprising:
   a conductive pattern formed on portions of the buried bit lines between the vertical pillar transistors.

9. The semiconductor device according to claim 8, wherein the conductive pattern is formed of epi-silicon.

10. The semiconductor device according to claim 9, wherein the conductive pattern formed of the epi-silicon has a height in the range of 100~2,000 Å and a width in the range of 100~2,000 Å.

11. The semiconductor device according to claim 9, wherein the conductive pattern formed of the epi-silicon is doped with impurities.

12. A method for manufacturing a semiconductor device, comprising the step of:
    forming buried bit lines by growing epi-silicon in a silicon substrate to be brought into contact with drain areas of vertical pillar transistors, the buried bit lines being arranged along a first direction;
    forming a conductive pattern on portions of the buried bit lines between the vertical pillar transistors.

13. The method according to claim 12, wherein the buried bit lines formed of the epi-silicon have a thickness in the range of 100~3,000 Å.

14. The method according to claim 12, wherein the conductive pattern is formed of epi-silicon.

15. The method according to claim 14, wherein the conductive pattern formed of the epi-silicon has a height in the range of 100~2,000 Å and a width in the range of 100~2,000 Å.

16. The method according to claim 14, wherein the conductive pattern formed of the epi-silicon is doped with impurities.

17. A method for manufacturing a semiconductor device, comprising the steps of:
    etching a silicon substrate to form a plurality of silicon pillars;
    etching portions of the silicon substrate between the silicon pillars to define trenches extending along a first direction;
    growing epi-silicon in the trenches to form buried bit lines;
    isotropically etching surfaces of lower portions of the silicon pillars;
    forming gates buried in the lower portions of the silicon pillars which are isotropically etched;
    defining drain areas in portions of the silicon substrate under the gates;
    etching the buried bit lines such that the buried bit lines, which adjoin each other along a second direction perpendicular to the first direction, are separated from each other;
    filling a first insulation layer between and on the separated buried bit lines;
    forming word lines on the first insulation layer to connect the gates, the word lines being arranged along the second direction;
    filling a second insulation layer between the silicon pillars including the word lines; and
    defining source areas in portions of the silicon pillars over the gates such that vertical pillar transistors are constructed.

18. The method according to claim 17, wherein the step of forming the silicon pillars comprises the steps of:
    forming a hard mask on the silicon substrate to cover silicon pillar forming areas;
    etching the silicon substrate to define first grooves;
    forming spacers on sidewalls of the first grooves and the hard mask; and
    etching portions of the silicon substrate on bottoms of the first grooves using the hard mask and the spacers as an etch mask to define second grooves.

19. The method according to claim 17, wherein the buried bit lines formed of the epi-silicon have a thickness in the range of 100~3,000 Å.

20. The method according to claim 17, further comprising the step of:

forming a conductive pattern on portions of the buried bit lines between the vertical pillar transistors.

21. The method according to claim 20, wherein the conductive pattern is formed of epi-silicon.

22. The method according to claim 21, wherein the conductive pattern formed of the epi-silicon has a height in the range of 100~2,000 Å and a width in the range of 100~2,000 Å.

23. The method according to claim 21, wherein the conductive pattern formed of the epi-silicon is doped with impurities.

* * * * *